(12) United States Patent
Yun

(10) Patent No.: US 7,427,542 B2
(45) Date of Patent: Sep. 23, 2008

(54) SEMICONDUCTOR DEVICE AND METHOD OF MANUFACTURING THE SAME

(75) Inventor: Yeo-Jo Yun, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 90 days.

(21) Appl. No.: 11/639,212

(22) Filed: Dec. 15, 2006

(65) Prior Publication Data

US 2007/0148849 A1 Jun. 28, 2007

(30) Foreign Application Priority Data

Dec. 28, 2005 (KR) .................... 10-2005-0131518

(51) Int. Cl.
*H01L 21/337* (2006.01)
*H01L 21/8238* (2006.01)

(52) U.S. Cl. ............... 438/189; 438/202; 257/E21.632

(58) Field of Classification Search ................ 438/186, 438/189, 191, 199, 202–205; 257/E21.544, 257/E21.372, E21.37, E21.352

See application file for complete search history.

(56) References Cited

U.S. PATENT DOCUMENTS 5,356,821 A * 10/1994 Naruse et al. ............... 438/234
6,011,283 A * 1/2000 Lee et al. .................... 257/273
6,828,635 B2 * 12/2004 Panday et al. ............... 257/370
6,861,325 B1 * 3/2005 Pan et al. .................... 438/325
6,972,466 B1 * 12/2005 Liang et al. ................. 257/370
2007/0034958 A1 * 2/2007 Kim ........................... 257/355
2007/0063303 A1 * 3/2007 Lim ........................... 257/461
2007/0077697 A1 * 4/2007 Lin et al. .................... 438/199

\* cited by examiner

*Primary Examiner*—Scott B. Geyer
*Assistant Examiner*—Mohsen Ahmadi
(74) *Attorney, Agent, or Firm*—Finnegan, Henderson, Farabow, Garrett & Dunner, L.L.P.

(57) ABSTRACT

A method of manufacturing a semiconductor device including a complementary metal oxide semiconductor (CMOS) and a bipolar junction transistor (BJT), the method comprising the steps of: forming a gate oxide layer on a substrate having a p-type and an n-type well; removing the gate oxide layer on the p-type well; forming bases on the p-type well; forming a first photosensitive layer pattern that exposes the bases on the substrate; implanting p-type impurity ions into the bases through the first photosensitive layer pattern; removing the first photosensitive layer pattern; forming a second photosensitive layer pattern that exposes the p-type and the n-type wells; and implanting n-type impurity ions into the p-type and the n-type wells through the second photosensitive layer pattern to form an emitter and a collector, respectively, to form the BJT. Therefore, CMOS manufacturing processes are used to form a high frequency BJT having improved frequency and noise characteristics.

5 Claims, 3 Drawing Sheets

SEMICONDUCTOR DEVICE AND METHOD OF MANUFACTURING THE SAME

RELATED APPLICATION

This application claims the benefit of priority to Korean patent application number 10-2005-0131518, filed on Dec. 28, 2005, which is incorporated herein by reference in its entirety.

BACKGROUND

1. Technical Field

The present invention relates to a semiconductor device and a method of manufacturing the same.

2. Description of the Related Art

A complementary metal oxide semiconductor (CMOS) device typically has an excellent frequency response characteristic; however, the noise characteristic and the power gain characteristic thereof are inferior to those of a compound semiconductor device at high frequencies. In particular, as the semiconductor device is reduced in size, the serial resistance, the primary contributing factor of the noise characteristic, of a gate electrode increases accordingly such that the noise characteristic deteriorates. Therefore, a bipolar junction transistor (hereinafter referred to as BJT) having an excellent noise characteristic is formed in a specific portion of a CMOS semiconductor device.

However, since a high frequency BJT is formed by a polysilicon emitter process using about four to five additional masks, the manufacturing processes of the CMOS semiconductor device are complicated. Also, when the high frequency BJT is formed in the CMOS semiconductor device, the frequency characteristic of the CMOS semiconductor device deteriorates due to the BJT having a poor frequency characteristic.

SUMMARY

Embodiments consistent with the present invention provide a semiconductor device having improved frequency and noise characteristics by using manufacturing processes of a complementary metal oxide semiconductor (CMOS) device.

Consistent with an embodiment of the present invention, there is provided a method of manufacturing a semiconductor device including a complementary metal oxide semiconductor (CMOS) and a bipolar junction transistor (BJT), the method including the steps of forming a gate oxide layer on a semiconductor substrate in which a p-type well and an n-type well are formed; removing the gate oxide layer on the p-type well; forming bases made of polysilicon on the p-type well; forming a first photosensitive layer pattern that exposes the bases on the semiconductor substrate; implanting p-type impurity ions into the bases through the first photosensitive layer pattern; removing the first photosensitive layer pattern; forming a second photosensitive layer pattern that expose the p-type well and the n-type well on the bases and the semiconductor substrate; and implanting n-type impurity ions into the p-type well and the n-type well through the second photosensitive layer pattern to form an emitter and a collector, respectively, to form the BJT.

Consistent with another embodiment of the present invention, there is provided a semiconductor device including a semiconductor substrate including a p-type well in which an emitter is formed and an n-type well in which a collector is formed; bases formed on the p-type well; an insulating layer formed on the bases and the semiconductor substrate; and an emitter contact, base contacts, and a collector contact for filling contact holes formed in the insulating layer to be connected to the emitter, the bases, and the collector, respectively.

BRIEF DESCRIPTION OF THE DRAWINGS

The above and other objects and features of the present invention will become apparent from the following description of embodiments given in conjunction with the accompanying drawings.

DETAILED DESCRIPTION

Figure 1:
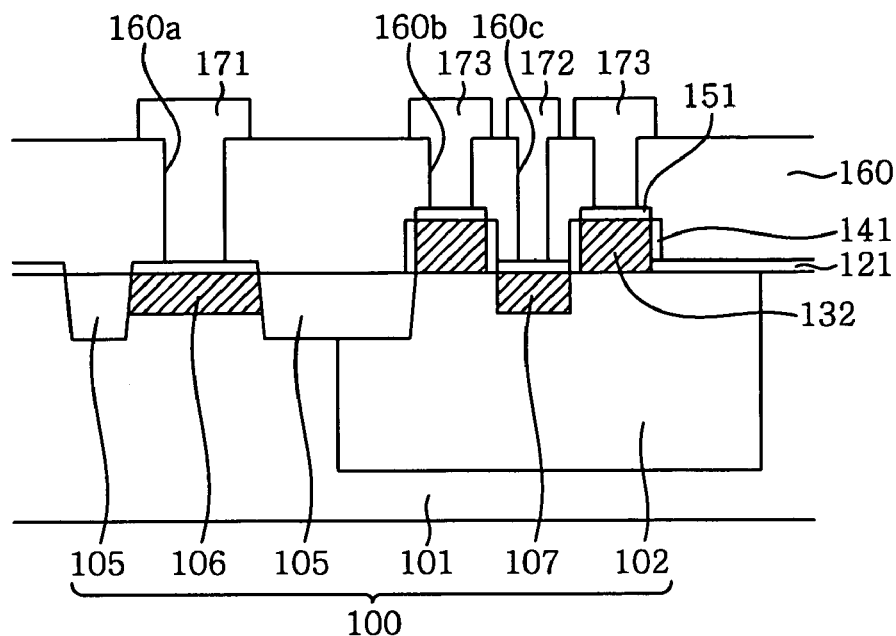
FIG. 1 illustrates a semiconductor device consistent with an embodiment of the present invention.

Hereinafter, preferred embodiments of the present invention will be described in detail with reference to the accompanying drawings so that they can be readily implemented by those skilled in the art. The present invention may, however, be embodied in many different forms and should not be construed as being limited to the embodiments set forth herein.

In the drawings, the thickness of layers and regions are exaggerated for clarity. The same reference numerals in different drawings represent the same element. It will also be understood that when a layer is referred to as being "on" another layer, film, region, or substrate, it can be "directly on" the other layer, film, region, or substrate, or intervening layers may also be present. On the other hand, when a layer is referred to as being "directly on" another layer, film, region, or substrate, it means that there are no intervening layers.

A semiconductor device and a method of manufacturing the same consistent with an embodiment of the present invention will be described with reference to the attached drawings.

FIG. 1 is a sectional view of a semiconductor device consistent with an embodiment of the present invention.

As illustrated in FIG. 1, the semiconductor device is formed on a semiconductor substrate 100 where a complementary metal oxide semiconductor (CMOS) device is formed. A p-type well 102 and an n-type well 101 are formed in the semiconductor substrate 100. Then, an emitter 107 is formed in the p-type well 102 and a collector 106 is formed in the n-type well 101. N-type impurity ions are then implanted into emitter 107 and collector 106.

A plurality of bases 132 made of polysilicon are then formed on p-type well 102 on both sides of emitter 107. P-type impurity ions are then implanted into bases 132.

An insulating layer 160 is then formed on the bases 132 and the semiconductor substrate 100. Silicides 151 are then formed on emitter 107, bases 132, and collector 106.

Contact holes 160a, 160b, and 160c that expose silicides 151 are formed in the insulating layer 160. And then, a collector contact 171, base contacts 173, and an emitter contact 172 are formed to fill respective contact holes 160a, 160b, and 160c formed in the insulating layer 160. Emitter 107, bases 132, and collector 106 constitute a bipolar junction transistor (BJT).

FIGS. 2 to 6 illustrate a method of manufacturing the semiconductor device consistent with an embodiment of the present invention.

Figure 2:
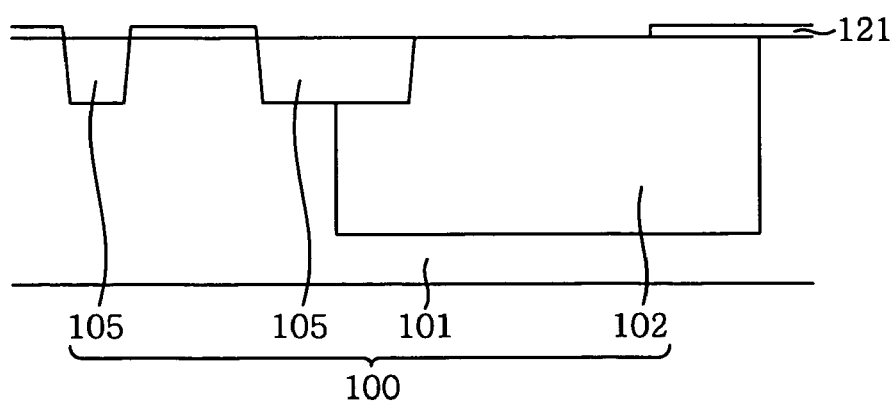
FIGS. 2 to 6 illustrate a method of manufacturing the semiconductor device consistent with an embodiment of the present invention.

As illustrated in FIG. 2, a gate oxide layer 121 is formed on semiconductor substrate 100 having n-type well 101, p-type well 102, and device isolation regions 105 for isolating n-type well 101 and p-type well 102 from each other formed therein.

Then, a portion of gate oxide layer 121 on p-type well 102 is removed using a gate oxide layer removing mask (not shown) to expose a portion of p-type well 102. The gate oxide layer removing mask removes only the portion of gate oxide layer 121 on p-type well 102 in the region where the BJT will be formed.

Figure 3:
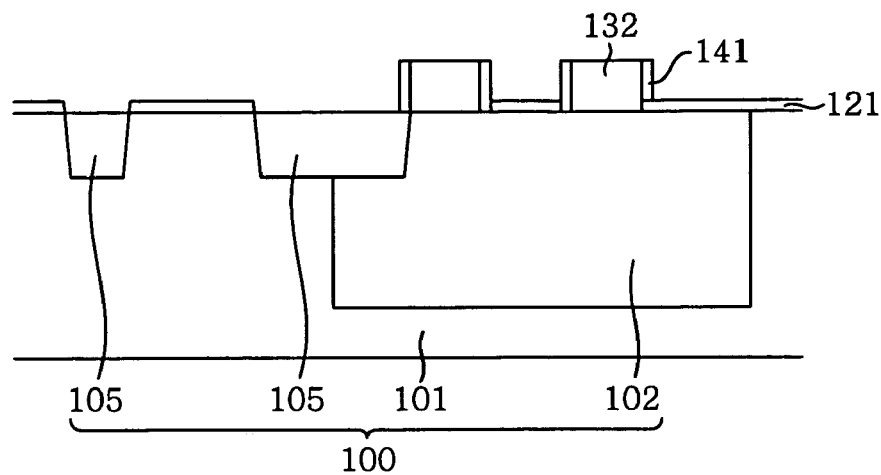

Then, as illustrated in FIG. 3, bases 132 formed of polysilicon are formed on the exposed portion of p-type well 102. Simultaneously, the gate electrode (not shown) of the CMOS is also formed. Then, side wall spacers 141 are formed on the side walls of bases 132.

Figure 4:
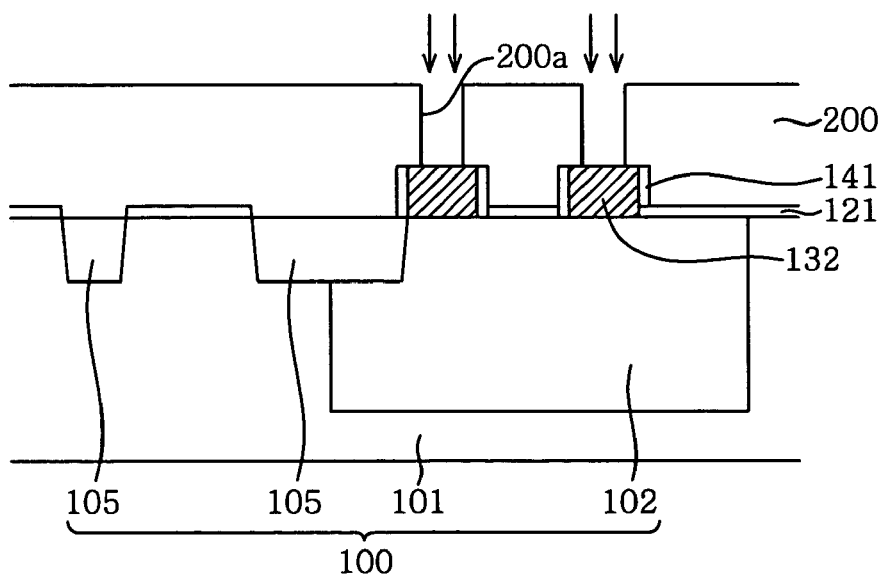

Thereafter, as illustrated in FIG. 4, a first photosensitive layer pattern 200 is formed on the bases 132 and semiconductor substrate 100, exposing the top surfaces of bases 132. Then, p-type impurity ions are implanted into bases 132 through first photosensitive layer pattern 200. Therefore, p-type bases 132 are formed. Furthermore, the source and drain regions (not shown) of a PMOS in the CMOS are also formed. Since gate oxide layer 121 does not exist under p-type base 132, p-type bases 132 and p-type well 102 are electrically connected to each other. Then, first photosensitive layer pattern 200 is removed.

Figure 5:
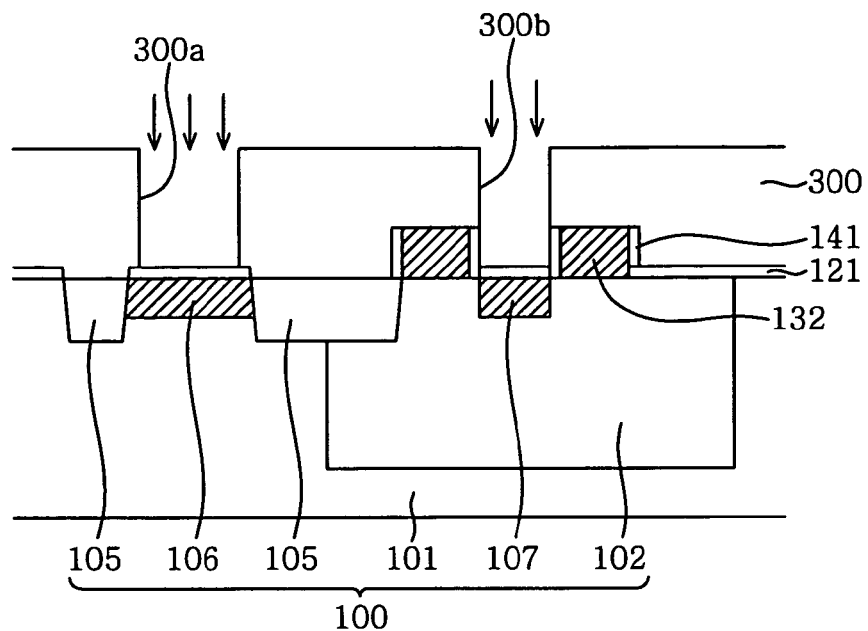

In sequence, as illustrated in FIG. 5, a second photosensitive layer pattern 300 is formed on bases 132 and the semiconductor substrate 100, exposing p-type well 102 and n-type well 101. And then, the n-type impurity ions are implanted into p-type well 102 and n-type well 101 through second photosensitive layer pattern 300. Therefore, n-type emitter 107 is formed in p-type well 102 and n-type collector 106 is formed in n-type well 101. Furthermore, the source and drain regions (not shown) of an NMOS in the CMOS are also formed.

Then, second photosensitive layer pattern 300 is removed. In this embodiment, since bases 132 and emitter 107 are aligned with each other by side wall spacers 141, it is possible to maintain a uniform distance between bases 132 and emitter 107.

Figure 6:
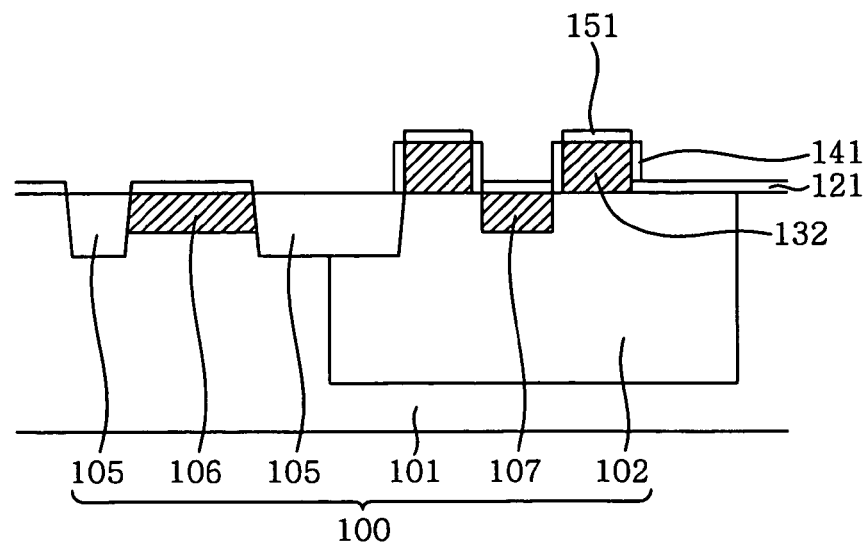

As illustrated in FIG. 6, silicides 151 are formed on bases 132, emitter 107, and collector 106, sequentially, and insulating layer 160 made of an oxide layer is formed on the resultant layer. Further, silicides (not shown) are formed on the gate electrode and the source and drain regions of the CMOS.

Thereafter, as illustrated in FIG. 1, contact holes 160a, 160b, and 160c that expose silicides 151 are formed in insulating layer 160. And then, contact holes 160a, 160b, and 160c are filled with metal layers (base contacts 173, emitter contact 172, and collector contact 171, respectively) that are connected to bases 132, emitter 107, and collector 106, respectively, to form the BJT.

As described above, in the method of manufacturing the semiconductor device consistent with the present invention, a process of forming n-type well 101 and a process of forming the mask for removing gate oxide layer 121 formed on p-type well 102 are included in the CMOS manufacturing processes, which leads to the formation of a high frequency BJT. Thus, the manufacturing processes are simplified.

Also, since bases 132 and emitter 107 in the BJT are aligned such that the distance between bases 132 and emitter 107 is uniform, it is possible to prevent current from becoming unbalanced, thus improving device characteristics.

Also, since p-type base 132 is formed of polysilicon and gate oxide layer 121 does not exist under p-type base 132, it is possible to reduce serial resistance between p-type bases 132 and emitter 107. Therefore, the base resistance that determines the high frequency characteristic is reduced such that the frequency and noise characteristics of the device are improved.

In the semiconductor device and the method of manufacturing the same consistent with the present invention, the CMOS manufacturing processes are used to form the high frequency BJT, thereby improving the frequency and noise characteristics.

While the invention has been shown and described with respect to several embodiments, it will be understood by those skilled in the art that various changes and modifications may be made without departing from the spirit and scope of the invention as defined in the following claims.

What is claimed is:

1. A method of manufacturing a semiconductor device including a complementary metal oxide semiconductor (CMOS) and a bipolar junction transistor (BJT), the method comprising the steps of:
   forming a gate oxide layer on a substrate in which a p-type well and an n-type well are formed;
   removing the gate oxide layer on the p-type well;
   forming bases made of polysilicon on the p-type well;
   forming a first photosensitive layer pattern that exposes the bases on the substrate;
   implanting p-type impurity ions into the bases through the first photosensitive layer pattern;
   removing the first photosensitive layer pattern;
   forming a second photosensitive layer pattern that exposes the p-type well and the n-type well on the bases and the substrate; and
   implanting n-type impurity ions into the p-type well and the n-type well through the second photosensitive layer pattern to form an emitter and a collector of the BJT.

2. The method of claim 1, wherein the gate electrode of the CMOS is formed when the bases are formed.

3. The method of claim 1, wherein p-type impurity ions are implanted into the source and drain regions of a PMOS in the CMOS when the p-type impurity ions are implanted into the bases.

4. The method of claim 1, wherein n-type impurity ions are implanted into the source and drain regions of the PMOS in the CMOS when the n-type impurity ions are implanted into the p-type well and the n-type well.

5. The method of claim 1, further comprising the steps of:
   forming silicides on the bases, the emitter, and the collector;
   forming an insulating layer having contact holes that expose the silicides on the substrate; and
   forming base contacts, an emitter contact, and a collector contact for filling the contact holes.

* * * * *